(12) United States Patent
Bickford et al.

(10) Patent No.: US 8,949,767 B2
(45) Date of Patent: Feb. 3, 2015

(54) RELIABILITY EVALUATION AND SYSTEM FAIL WARNING METHODS USING ON CHIP PARAMETRIC MONITORS

(71) Applicant: Mentor Graphics Corporation, Wilsonville, OR (US)

(72) Inventors: Jeanne P. Bickford, Essex Junction, VT (US); John R. Goss, South Burlington, VT (US); Nazmul Habib, South Burlington, VT (US); Robert McMahon, Essex Junction, VT (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/960,704

(22) Filed: Aug. 6, 2013

(65) Prior Publication Data

US 2013/0326442 A1 Dec. 5, 2013

Related U.S. Application Data

(60) Continuation of application No. 13/344,178, filed on Jan. 5, 2012, now Pat. No. 8,504,975, which is a division of application No. 11/874,950, filed on Oct. 19, 2007, now Pat. No. 8,095,907.

(51) Int. Cl.
*G06F 17/50* (2006.01)
*G01R 31/28* (2006.01)

(52) U.S. Cl.
CPC ........ *G06F 17/5045* (2013.01); *G01R 31/2894* (2013.01)
USPC .......................................... 716/136; 716/101

(58) Field of Classification Search
CPC .................................. G06F 17/50; G06F 11/22
USPC .................................................... 716/101, 136
See application file for complete search history.

(56) References Cited

U.S. PATENT DOCUMENTS

| | | | |
|---|---|---|---|
| 5,068,547 A | 11/1991 | Gascoyne | |
| 5,719,495 A * | 2/1998 | Moslehi | 356/630 |
| 6,476,632 B1 | 11/2002 | La Rosa et al. | |
| 6,500,715 B2 | 12/2002 | Matsuzaki et al. | |
| 6,535,013 B2 | 3/2003 | Samaan | |
| 6,724,214 B2 | 4/2004 | Manna et al. | |
| 6,762,966 B1 | 7/2004 | LaRosa et al. | |
| 6,903,564 B1 | 6/2005 | Suzuki | |
| 6,988,017 B2 * | 1/2006 | Pasadyn et al. | 700/121 |
| 7,003,742 B2 | 2/2006 | Saxena et al. | |
| 7,205,854 B2 | 4/2007 | Liu | |
| 7,383,521 B2 | 6/2008 | Smith et al. | |
| 7,487,477 B2 | 2/2009 | Bickford et al. | |
| 7,656,182 B2 | 2/2010 | Bickford et al. | |
| 7,761,278 B2 | 7/2010 | Chidambarrao et al. | |
| 8,095,907 B2 | 1/2012 | Bickford et al. | |
| 8,490,040 B2 | 7/2013 | Bickford et al. | |
| 8,504,975 B2 | 8/2013 | Bickford et al. | |

(Continued)

*Primary Examiner* — Thuan Do
(74) *Attorney, Agent, or Firm* — Klarquist Sparkman, LLP

(57) ABSTRACT

A method of reliability evaluation and system fail warning using on chip parametric monitors. The method includes determining impact of parametric variation on reliability by identifying key parametric questions to be answered by stress, identifying parametric macros for each parameter, and identifying layout sensitive areas of evaluation. The process can also include a set of parametric macros in one of a test site or a product to be stressed, testing the set of parametric macros prior to start of stress and at each stress read out, and setting life time parameter profile for technology.

17 Claims, 3 Drawing Sheets

(56) References Cited

U.S. PATENT DOCUMENTS

| | | |
|---|---|---|
| 8,543,966 B2 | 9/2013 | Bickford et al. |
| 8,560,990 B2 | 10/2013 | Barwin et al. |
| 8,707,233 B2 | 4/2014 | Foreman et al. |
| 8,719,763 B1 | 5/2014 | Bickford et al. |
| 8,726,201 B2 | 5/2014 | Bickford et al. |
| 2004/0051553 A1 | 3/2004 | Manna et al. |
| 2012/0105240 A1 | 5/2012 | Bickford et al. |
| 2013/0326442 A1 | 12/2013 | Bickford et al. |

\* cited by examiner

RELIABILITY EVALUATION AND SYSTEM FAIL WARNING METHODS USING ON CHIP PARAMETRIC MONITORS

CROSS REFERENCE TO RELATED APPLICATIONS

The present application is a continuation of U.S. application Ser. No. 13/344,178, filed on Jan. 5, 2012, now U.S. Pat. No. 8,504,975, which is a divisional application of U.S. application Ser. No. 11/874,950, filed on Oct. 19, 2007, now U.S. Pat. No. 8,095,907, the contents of which are incorporated by reference herein in their entirety.

FIELD OF THE INVENTION

The invention generally relates to methods for evaluating reliability and for providing warnings prior to system failures.

BACKGROUND OF THE INVENTION

Defects in integrated circuits can result in circuits that do not meet the required specifications. These defects can be caused through the manufacturing process and/or can arise over time. Moreover, these defects can result in hard failures or catastrophic faults, e.g., short circuits or open circuits, or can manifest themselves as subtle changes in electrical operation or parametric faults, e.g., increased current leakage or changes in circuit timing.

In integrated circuits, shifts of threshold voltages (Vt) over the lifetime of the chip can result in system failures. Parts of the integrated circuit, such as devices and circuits to be measured, are conventionally designed according to a modeled predetermined shift. However, some parts will shift more than the modeled shift over the lifetime of the part.

If the actual shift for parts could be measured, such parts could be replaced before the system fails. However, there is no conventional method to measure in system and/or to provide early warning of system fail. Thus, there exists no conventional manner for addressing potential fails with preventative maintenance.

Further, conventional reliability assessment techniques in integrated circuits generally require extensive measurement and stress of many different circuits. According to these techniques, semiconductor products being tested are first measured to ascertain a set of functional criteria for the chip and thereafter the semiconductor products are stressed and then remeasured. The measured data is evaluated to empirically determine both fail rate and to predict reliability.

The above-discussed conventional techniques depend on empirical validation. In particular, in order to identify the separate parametric, e.g., current or threshold voltage, and defect, e.g., particle, contribution under conventional techniques, failure analysis is required. Moreover, the ability to measure parametric variation according to the conventional techniques is limited.

Further, the conventional techniques are merely representative of problems. In this regard, because structures used to measure parametric variation are not cycled during stress, these structures are not representative of stressed circuits. Still further, according to the conventional techniques, the impact of different layout environments on layout cannot be assessed.

SUMMARY OF THE INVENTION

According to an aspect of the invention, the invention is directed to a method of reliability evaluation and system fail warning using on chip parametric monitors. The method includes determining impact of parametric variation on reliability by identifying key parametric questions to be answered by stress, identifying parametric macros for each parameter, identifying layout sensitive areas of evaluation, including set of parametric macros in one of a test site or a product to be stressed, testing the set of parametric macros prior to start of stress and at each stress read out, and setting life time parameter profile for technology.

In accordance with another aspect of the invention, a method is provided for monitoring a semiconductor product. The method includes inserting key parameters related to at least one of stress and device failure, identifying at least one parametric macro related to the key parameters, inserting the at least one parametric macro on the semiconductor product, and at least one of monitoring at least one of the key parameters and issuing a warning when the device failure is approached, and stressing the semiconductor product and testing the stressed semiconductor product.

According to a further aspect, the invention is directed to a system for assessing reliability of a chip under test. The system includes a computer infrastructure having executable code configured to identify parametric variation over product life, identify sensitivity of each key parameter, identify an across chip variation over lifetime, and identify a layout dependent chip parametric variation over lifetime.

BRIEF DESCRIPTION OF THE DRAWINGS

The invention is described in the detailed description which follows, in reference to the noted plurality of drawings by way of non-limiting examples of exemplary embodiments of the present invention.

DETAILED DESCRIPTION OF EMBODIMENTS OF THE INVENTION

The invention provides a method that identifies when semiconductor product parameters, e.g., threshold voltages (Vt), current, resistance, capacitance, etc., have shifted close to limits that may result in a system failure so that preventative action can be taken to replace the part before the system fails. According to embodiments, the inventive method can be utilized with any integrated circuit that allows device level parametric measurements in a system diagnostic mode.

The invention further provides a method for reliability assessment that allows easy separation of parametric and defect contribution to fail mechanisms. The invention also provides for quantifying use condition impact and layout impact on reliability fail mechanisms. The method according to the invention can use any integrated circuit that allows device level parametric measurements in a manufacturing test environment to determine parametric values at in wafer test, or module test.

Figure 1:
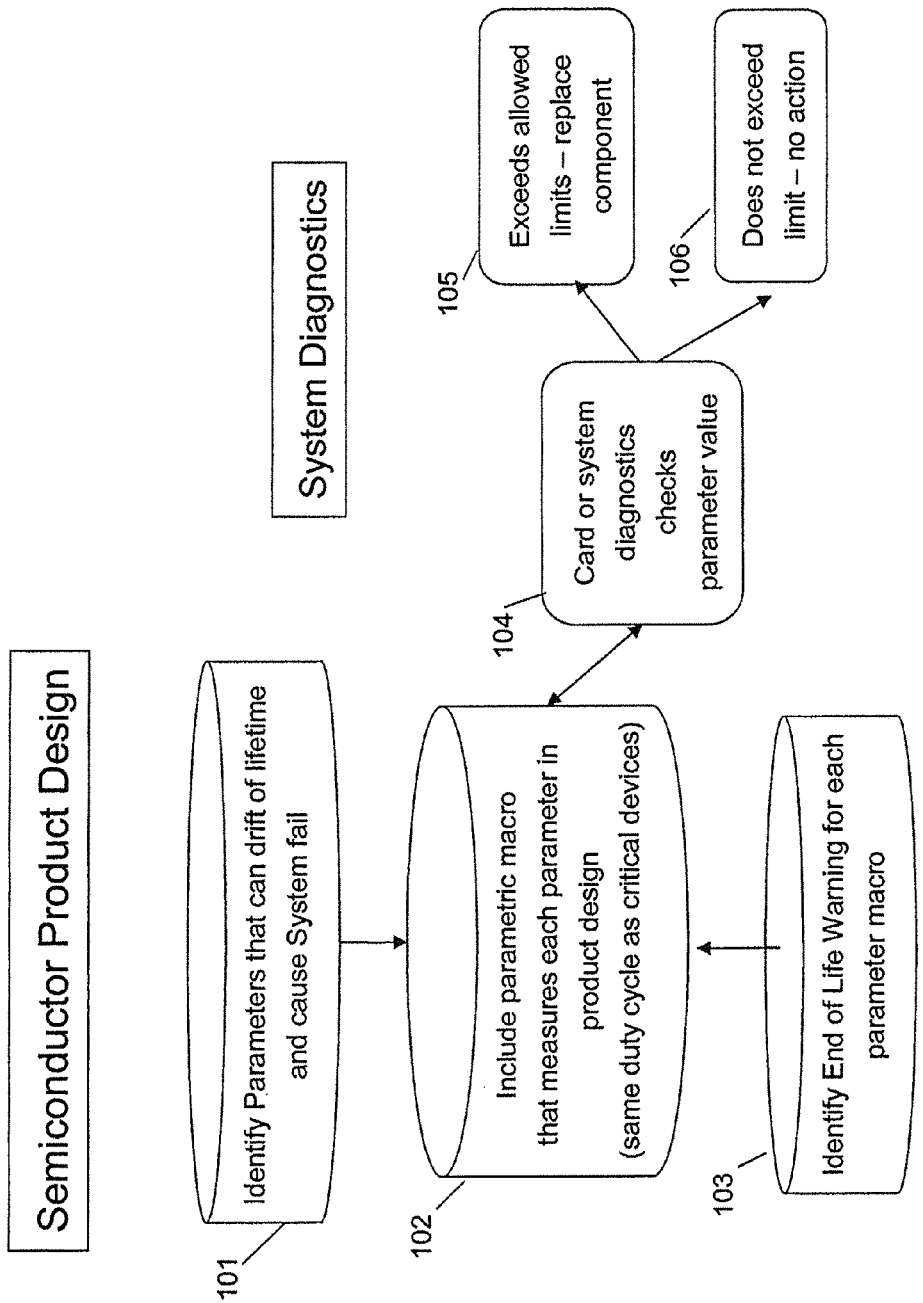
FIG. 1 illustrates an exemplary diagram of the operation of a system level diagnostic.
Figure 2:
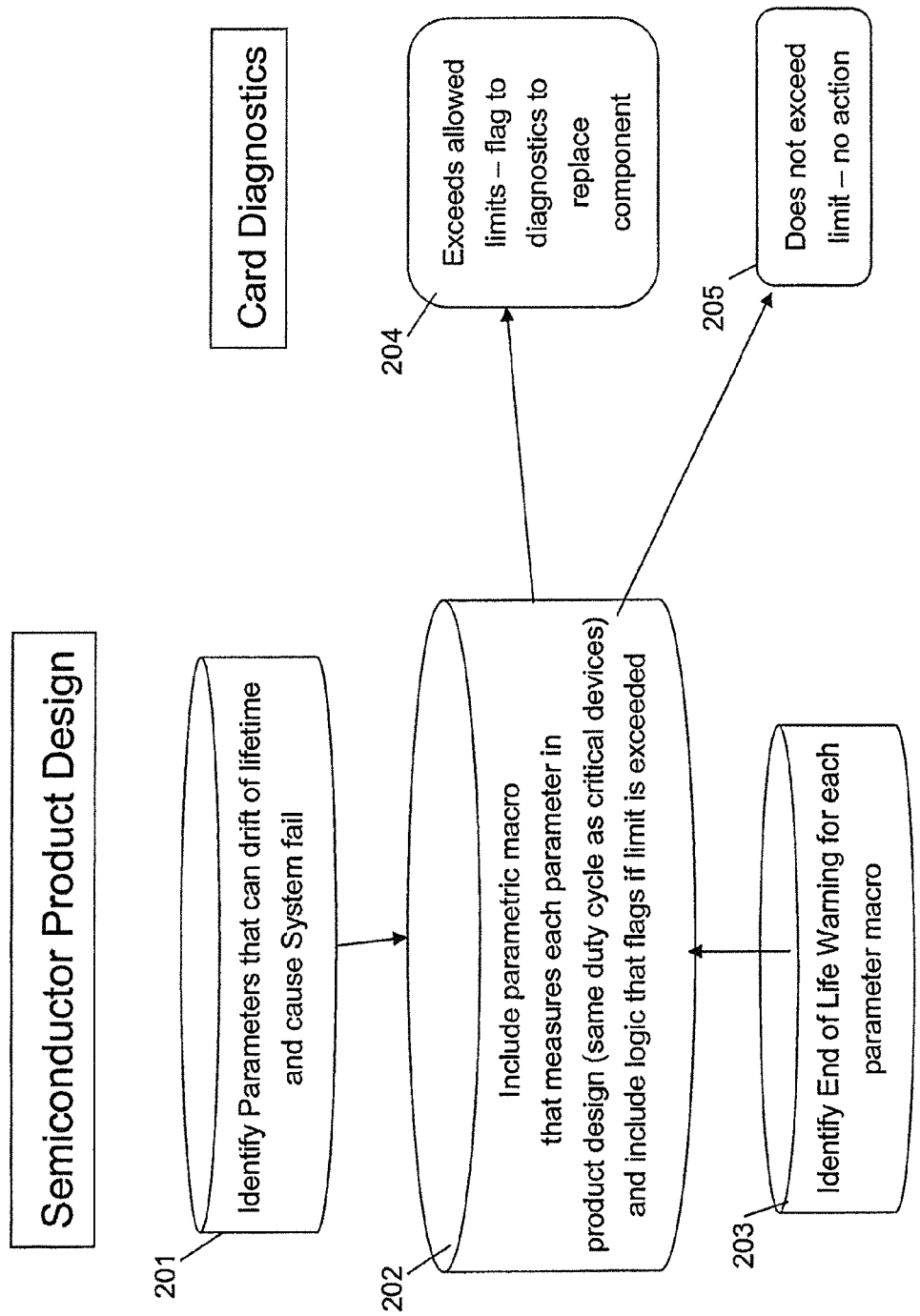
FIG. 2 illustrates an exemplary diagram of the operation of a card diagnostic.
Figure 3:
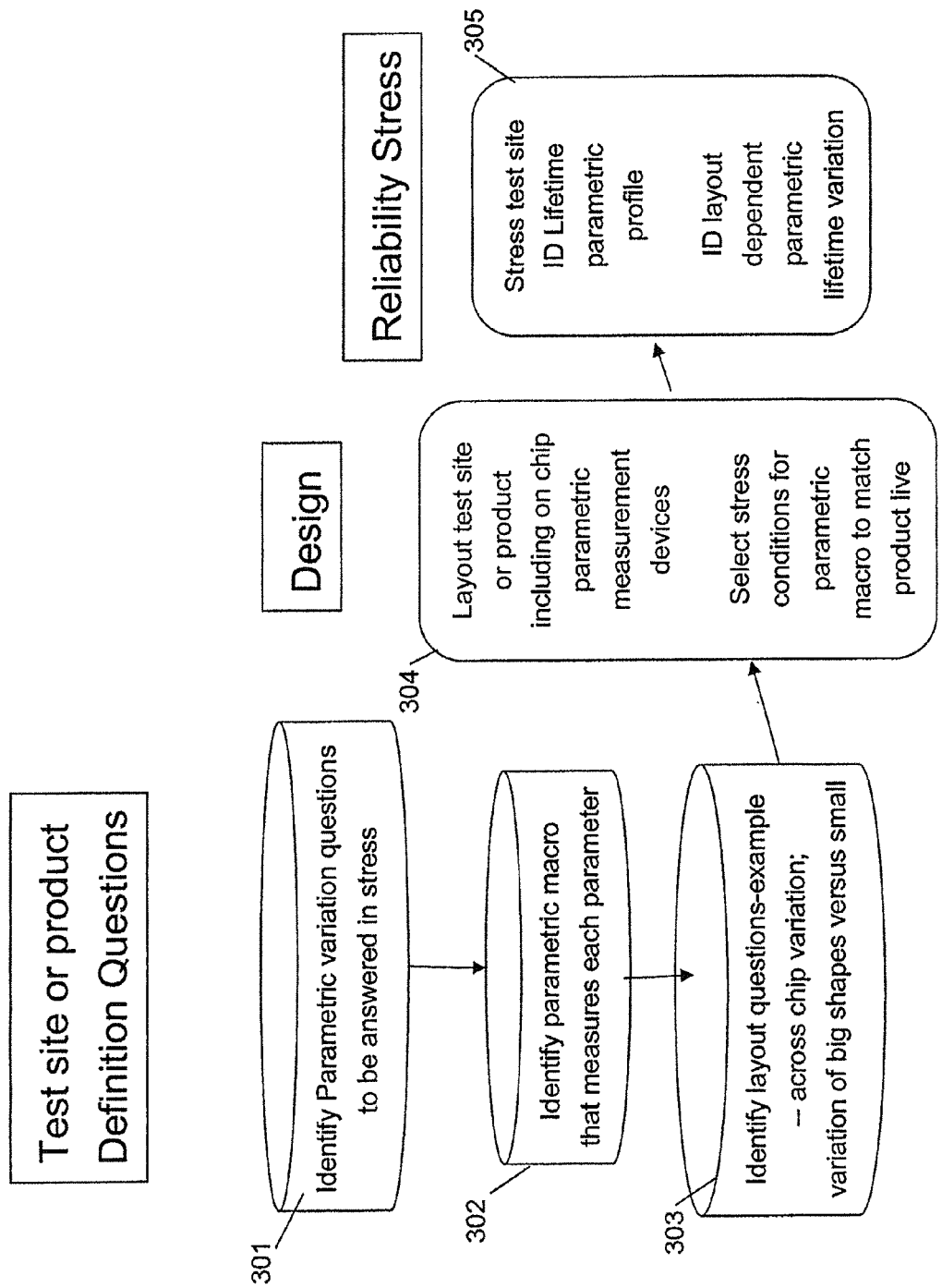
FIG. 3 illustrates an exemplary process flow that can be utilized as part of a qualification of a part, chip, or design system.

FIGS. 1-3 are flow diagrams showing processing steps of embodiments of the invention. FIGS. 1-3 may equally represent a high-level block diagram of components of the invention implementing the steps thereof. The steps of FIGS. 1-3 may be implemented on computer program code in combination with the appropriate hardware. This computer program code may be stored on storage media such as a diskette, hard disk, CD-ROM, DVD-ROM or tape, as well as a memory storage device or collection of memory storage devices such as read-only memory (ROM) or random access memory (RAM). Additionally, the computer program code can be transferred to a workstation over the Internet or some other type of network.

The invention can take the form of an entirely hardware embodiment or an embodiment containing both hardware and software elements (any of which is referred generally as "file management program"). The hardware and software elements include a computer infrastructure configured to implement the functionality of the present invention. The software elements may be firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

According to embodiments, the invention utilizes methodologies based upon one or more parametric macros, e.g., a scalable parametric measurement (SPM) macro, created to measure or monitor each parameter of interest for each part. The SPM macro is described in commonly owned U.S. application Ser. No. 11/459,367, the disclosure of which is expressly incorporated by reference herein in its entirety. Further, it may be advantageous for the parametric macro to be an on-chip parametric performance monitoring system that can be included on product chips. In this manner, the chip can be tested at wafer final test, at module and/or at system test. A further benefit of the parametric macro can be that it may be placed anywhere on the chip, since no specific external pinout is necessary.

In accordance with a particular embodiment of the invention, a determination of a potential device or system failure can be made so preventative action can be taken. FIG. 1 illustrates an exemplary diagram of the operation of a system level diagnostic created to enable measurement of the system, and in particular, to determine a potential failure of chips or semiconductor product modules used in higher levels of assembly, e.g., cards, boards, or systems. The diagnostic test can be run as part of normal system maintenance so appropriate preventative action can be taken in the event parametric drifts exceed warning limits.

The method can begin during the chip design by the designers identifying at step 101 parameters that drift during the lifetime of the chip, e.g., threshold voltage, resistance, capacitance, and/or current, that can result in a system failure. At step 102, one or more parametric macros, e.g., SPMs, can be identified and stored in circuit logic within the chip or in software. In particular, one macro can be identified for one or more key parameters. The parametric macros can measure the parameters in the product design. These macros can be inserted in the semiconductor design in such a manner that they are accessible and controllable at module and can be incorporated into the system design using a same duty cycle as the product. At step 103, end of life warnings or fail limits for each parametric macro or key parameter can also be identified and stored on the chip. By way of non-limiting example, a warning can be given when the key parameter is within 10% of the fail limit to provide sufficient time to take corrective action. Moreover, system maintenance flags can be defined to alert the user when any of these end of life warnings or fail limits are reached/exceeded.

At step 104, the method can further include checking parameter values with system diagnostics. If an end of life warning or fail limit is reached or exceeded for any identified parameter of the chip, a system maintenance flag alerts the user at step 105 that the chip should be replaced before the system fails. If the warnings or limits are not reached or exceeded at step 106, no action is taken.

These warning limits can be stored so that, throughout the life of the chip, system diagnostics check the parameters to determine whether the system is near failure and to provide the user with sufficient warning to replace a failing chip prior to system failure.

FIG. 2 illustrates an alternative exemplary diagram of the operation of a card level diagnostic created to enable measurement of the system, and in particular, to determine a potential system failure. Like the method depicted in FIG. 1, this alternative exemplary method can begin during the chip design by the designers identifying at step 201 parameters that drift during the lifetime of the chip, e.g., threshold voltage, resistance, capacitance, and/or current, that can result in a system failure. At step 202, one or more parametric macros, e.g., SPMs, can be identified and stored in circuit logic within the chip. In particular, one macro can be identified for one or more key parameters. The parametric macros can measure the parameters in the product design. These macros can be inserted in the semiconductor design in such a manner that they are accessible and controllable at module and can be incorporated into the system design using a same duty cycle as the product. Further, warning flags can be built into chip logic, and the chip logic can send a parameter "reached/exceeded" flag to system. At step 203, the specific end of life warnings or fail limits for each parametric macro or key parameter can also be identified and stored on the chip to trigger the warning flags.

If an end of life warning or fail limit is reached or exceeded for any identified parameter of the chip during card diagnostics, a system maintenance flag to the diagnostics at step 204 indicates the chip should be replaced before the system fails. If the warnings or limits are not reached or exceeded at step 205, no action is taken.

In addition to determining potential system failures through the use of parametric macros on chips, these chip based parametric macros can also be utilized in a method for reliability assessment to allow easy separation of parametric and defect contribution to fail mechanisms. In this manner, key parameters can be analyzed under stress conditions for evaluation of the part, chip, or design system. The method can also provide for quantifying use condition impact and layout impact on reliability fail mechanisms. The method can be utilized in any integrated circuit that allows device level parametric measurements in a manufacturing test environment to determine parametric values at in wafer test, or module test.

FIG. 3 illustrates an exemplary process flow that can be utilized as part of a qualification of a part, chip, or design system. Moreover, this exemplary process flow can be utilized to establish a portfolio for similar geometries. The alternative exemplary method illustrated in FIG. 3 can begin with test site or product definition questions. In this regard, chip designers can identify at step 301 parametric variation questions to be answered by placing the chip or part under stress, e.g., how does threshold voltage/resistance/capacitance/current change, in order to qualify chips. At step 302, the designer can identify one or more parametric macros, e.g., SPMs, to measure each identified parameter, and, in particular, one macro can be identified for each identified parameter. As discussed above, the SPM macro is described in commonly owned U.S. application Ser. No. 11/459,367, the disclosure of which is expressly incorporated by reference herein in its entirety. These parametric macros can be stored, e.g., in circuit logic within the chip. Further, data collected by the parametric macro can include, e.g., turn on current (Ion), threshold voltage (Vt), back end of line (BEOL), and can be used to disposition the product, to provide feedback to the manufacturing line, and to establish an historical database of key parameters monitored at the fabrication and/or product level.

The designer can also identify, at step 303, layout questions, e.g., across chip variation; variation of big shapes vs. small. In this regard, layout sensitive areas of evaluation can be identified, e.g., with a thermal density assent tool, so testing occurs in areas of concern, e.g., density (population) differences, wide lines vs. thin lines, vias tightly or loosely distributed in BEOL, hot spots, etc. Thus, a set of parametric macros can be included in the test site or the product to be stressed, e.g., parametric macros can be included in the identified layout areas of concern and/or in areas of the chip needed to assess across chip variation.

During the design phase of the chip, the test site or product can be laid out at step 304. This test site or product layout can also include laying out the parametric measuring devices on the chip. Further, stress conditions for the parametric macros can be selected to match product life. By way of non-limiting example, stress conditions, e.g., run with a same duty cycle, may be provided for the parametric macros to match the logic or memory under test or the desired use conditions of the chip.

After the design phase, the process can begin reliability stressing of the chip or part. In this regard, at step 305, the test site or product can be stressed. As part of the test, parametric macros can be tested prior to stressing and at each stress read out. Further, the data may be used to measure parametric measurement change over the product life so as to identify a lifetime parametric profile. Additionally, layout dependent parametric lifetime variation can be identified to evaluate layout sensitivity. Moreover, data from the parametric macro can be read out dynamically while stressing the semiconductor product.

Thus, the invention can allow a lifetime parameter profile for technology to be set, which can include a base parametric profile, e.g., how the parameters change over time. Further, the invention can separate defect and parametric contribution in failures due to stress.

The invention can also provide a reliability assessment technique for the chip or parts under test. In this regard, the parametric variation can be identified over product life, the sensitivity of each key parameter can be identified, an across chip variation over lifetime can be identified, and a layout dependent chip parametric variation over lifetime can be identified.

The method as described above can be part of the design for an integrated circuit chip, as well as part of the resulting integrated circuit chip. The resulting integrated circuit chips can be distributed by the fabricator in raw wafer form (that is, as a single wafer that has multiple unpackaged chips), as a bare die, or in a packaged form. In the latter case, the chip can be mounted in a single chip package (such as a plastic carrier, with leads that are affixed to a motherboard or other higher level carrier) or in a multichip package (such as a ceramic carrier that has either or both surface interconnections or buried interconnections). In any case, the chip may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of a preferred embodiment, those skilled in the art will recognize that the invention can be practiced with modifications within the spirit and scope of the appended claims.

It is claimed:

1. One or more computer-readable storage having instruction thereon for executing a method for monitoring a semiconductor product, comprising:
    inserting at least one parametric macro onto the semiconductor product so that the parametric macro is stored within the semiconductor product, the parametric macro measuring at least a voltage level in the semiconductor product;
    monitoring the at least one parametric macro to determine whether the voltage level is within a threshold amount of a level that can cause the semiconductor product to fail; and
    issuing a warning that the semiconductor product is in danger of failing during use in response to the monitoring that the voltage level is within the threshold amount of the level that can cause the semiconductor product to fail.

2. The one or more computer-readable storage of claim 1, wherein the at least one parametric macro further includes multiple parametric macros for measuring resistance, capacitance and current.

3. The one or more computer-readable storage of claim 2, wherein the monitoring further includes monitoring the multiple parametric macros to determine whether the resistance, capacitance and current are within threshold amounts of levels that can cause the semiconductor product to fail.

4. The one or more computer-readable storage of claim 1, further including stressing the semiconductor product.

5. The one or more computer-readable storage of claim 1, wherein the at least one parametric macro comprises a scalable parametric macro.

6. The one or more computer-readable storage of claim 1, wherein issuing the warning includes setting a maintenance flag in a memory location within the semiconductor product.

7. The one or more computer-readable storage of claim 1, further including generating a parametric profile indicating how the voltage level changes over time.

8. The one or more computer-readable storage of claim 1, further comprising creating at least one of card and system diagnostics for measurement of the at least one parametric macro.

9. The one or more computer-readable storage of claim 1, further comprising inserting at least one of fail limits or warning levels in the at least one parametric macro.

10. The one or more computer-readable storage of claim 1, further comprising identifying layout sensitive areas, and inserting the at least one parametric macro in the identified layout sensitive areas.

11. The one or more computer-readable storage of claim 1, further including providing a system diagnostic mode of the semiconductor product which performs either the monitoring or stressing the semiconductor product, depending on the mode, and testing the stressed semiconductor product.

12. One or more computer-readable storage having instruction thereon for executing a method for monitoring a semiconductor product, comprising:
   inserting at least one parametric macro onto the semiconductor product so that the parametric macro is stored within circuit logic in the semiconductor product, the parametric macro measuring at least one parameter on the semiconductor product that is related to failure over time of use of the semiconductor product;
   monitoring the at least one parametric macro to determine whether the at least one parameter is within a threshold of a level that can cause the semiconductor product to fail; and
   in response to the monitoring, issuing a warning that the semiconductor product is in danger of failing.

13. One or more computer-readable storage of claim 12, wherein the at least one parameter includes at least one of a voltage, current, resistance or capacitance.

14. One or more computer-readable storage of claim 12, wherein the at least one parametric macro comprises a scalable parametric macro.

15. The one or more computer-readable storage of claim 12, further including stressing the semiconductor product.

16. The one or more computer-readable storage of claim 12, wherein issuing the warning includes setting a maintenance flag in a memory location within the semiconductor product.

17. The one or more computer-readable storage of claim 12, further including generating a parametric profile indicating how the at least one parameter changes over time.

* * * * *